United States Patent
Chuang et al.

(10) Patent No.: US 6,639,772 B2
(45) Date of Patent: Oct. 28, 2003

(54) ELECTROSTATIC DISCHARGE PROTECTION CIRCUIT FOR PROTECTING INPUT AND OUTPUT BUFFER

(75) Inventors: Chien-Hui Chuang, Taipei Hsien (TW); Kei-Kang Hung, Changhua Hsien (TW)

(73) Assignee: Faraday Technology Corp., Hsinchu (TW)

( * ) Notice: Subject to any disclaimer, the term of this patent is extended or adjusted under 35 U.S.C. 154(b) by 96 days.

(21) Appl. No.: 10/041,237

(22) Filed: Jan. 7, 2002

(65) Prior Publication Data

US 2003/0128486 A1 Jul. 10, 2003

(51) Int. Cl.[7] .................................................. H02H 3/00
(52) U.S. Cl. ........................ 361/56; 361/91.1; 361/111
(58) Field of Search ......................... 361/56, 91.1, 111, 361/58, 127

(56) References Cited

U.S. PATENT DOCUMENTS

| | | | |
|---|---|---|---|
| 5,815,360 A | * | 9/1998 | Consiglio et al. ............ 361/118 |
| 6,351,364 B1 | * | 2/2002 | Chen et al. .................. 361/111 |
| 6,424,510 B1 | * | 7/2002 | Ajit et al. ..................... 361/59 |
| 6,529,359 B1 | * | 3/2003 | Verhaege et al. ........... 361/100 |
| 6,538,868 B2 | * | 3/2003 | Chang et al. ............... 361/111 |
| 6,577,480 B1 | * | 6/2003 | Avery et al. ................ 361/56 |

* cited by examiner

*Primary Examiner*—Bao Q. Vu
(74) *Attorney, Agent, or Firm*—J. C. Patents (57) ABSTRACT

An electrostatic discharge (ESD) protection circuit for protecting input and output buffers. The ESD protection circuit is driven by a first voltage source and a second voltage source and coupled to a bonding pad. The ESD protection circuit has a first resistor, a first PMOS transistor, a first NMOS transistor, a first diode series, a second PMOS transistor, a second resistor, a third PMOS transistor, a second NMOS transistor, a second diode series and a third NMOS transistor. The electrical devices combine to form different types of ESD protection circuits, each capable of protecting the input buffer or output buffer against the damaging effects of an electrostatic discharge.

12 Claims, 6 Drawing Sheets

ELECTROSTATIC DISCHARGE PROTECTION CIRCUIT FOR PROTECTING INPUT AND OUTPUT BUFFER

BACKGROUND OF THE INVENTION

1. Field of Invention

The present invention relates to an electrostatic discharge (ESD) protection circuit. More particularly, the present invention relates to an electrostatic discharge (ESD) protection circuit for protecting input and output buffers.

2. Description of Related Art

In the process of manufacturing an integrated circuit (IC) such as a dynamic random access memory (DRAM) and a static random access memory (SRAM) or after complete fabrication of a silicon chip, electrostatic discharge (ESD) events are one of the principle reasons for IC failures. For example, somebody walking on a carpet in high relative humidity (RH) may generate several hundred to several thousand volts of static electricity. When the relative humidity of the surrounding air is low, over ten thousand volts of static electricity may be generated. In addition, some sealed machine IC package or instruments for monitoring IC chips may produce several hundred to several thousand volts of static electricity depending on weather and humidity factors.

Figure 1:
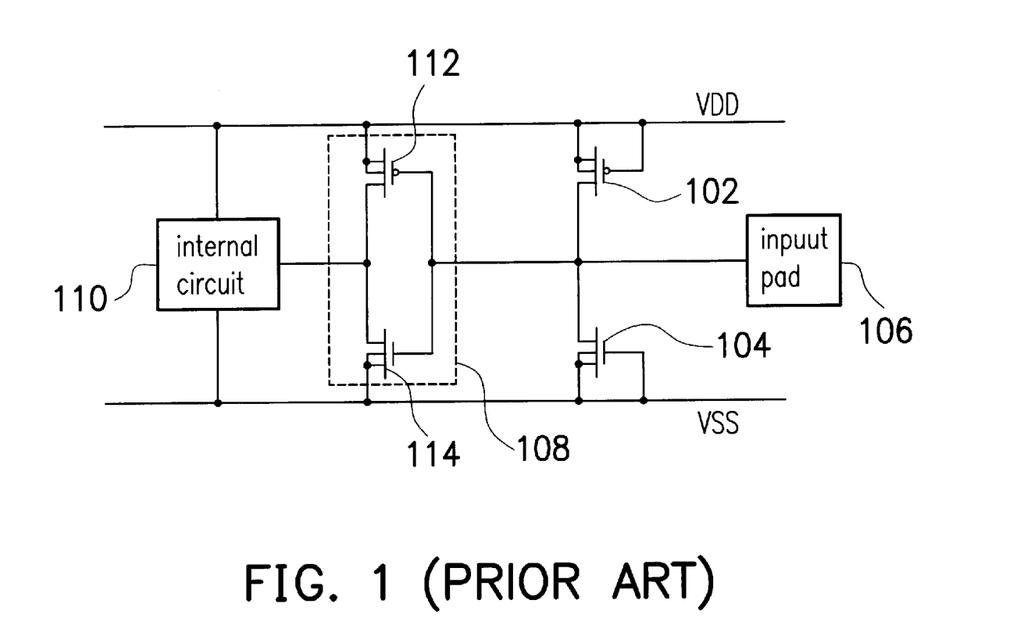
FIG. 1 is a diagram showing a gate-grounded conventional ESD protection circuit.

As soon as a charged body contacts a silicon chip, charges may discharge towards the chip leading to possible circuit breakdown and IC failure. To prevent any damage to the IC caused by an ESD, various ESD protection methods have been developed. FIG. 1 is a circuit diagram of a conventional ESD protection circuit. As shown in FIG. 1, the drain terminal of a PMOS transistor 102 is coupled to an input pad 106. The gate terminal, the source terminal and the substrate terminal of the PMOS transistor 102 are connected to a voltage source VDD. The drain terminal of an NMOS transistor 104 is coupled to an output pad 106. The gate terminal, the source terminal and the substrate terminal are connected to a voltage source VSS.

In a normal operating mode, the input pad is free of any electrostatic discharge. Since the gate terminal of the PMOS transistor 102 is coupled to the voltage source VDD and the gate terminal of the NMOS transistor 104 is coupled to the voltage source VSS, the PMOS transistor 102 and the NMOS transistor 104 are both in the cut off state. Hence, no leakage current flows from the PMOS transistor 102 and the NMOS transistor 104.

In the PS mode (a positive voltage pulse is applied to the input pad 106 with the source terminal VSS connected to ground), an electrostatic discharge in the form of a positive voltage pulse is applied to the input pad 106. The positive voltage pulse is transmitted to the drain terminal of the NMOS transistor 104. Moreover, the voltage source VSS terminal can be regarded as the ground connected during the ESD transient. Hence, once the positive voltage pulse exceeds the avalanche breakdown voltage of the drain and the substrate terminal of the NMOS transistor 104, the junction between the drain terminal and the substrate terminal breaks down. Ultimately, the drain terminal and the substrate terminal of the NMOS transistor 104 form an ESD bypass preventing the overloading of devices including the input buffer 108 and the internal circuit 110.

In the NS mode (a negative voltage pulse is applied to the input pad 106 with the voltage source VSS connected to ground), an electrostatic discharge in the form of a negative voltage pulse is applied to the input pad 106. The substrate terminal and the drain terminal of the NMOS transistor 104 form a parasitic diode (not shown). Moreover, voltage source VSS terminal can be regarded as connected to the ground during ESD transient. Hence, the parasitic diode (not shown) within the NMOS transistor 104 forms a forward bias bypass channeling away the current due to the passage of a negative voltage pulse through the input pad 106. With the parasitic diode (not shown) within the NMOS transistor 104 serving as a bypass, current surge produced by the ESD is prevented from overloading the input buffer 108 and the internal circuit 110.

In the PD mode (a positive voltage pulse is applied to the input pad 106 with the voltage source VDD connected to ground), an electrostatic discharge in the form of a positive voltage pulse is applied to the input pad 106. The substrate terminal and the drain terminal of the PMOS transistor 102 form a parasitic diode (not shown). Moreover, the voltage source VDD terminal can be regarded as connected to the ground during ESD transient. Hence, the parasitic diode (not shown) within the PMOS transistor 102 forms a forward bias bypass channeling away the current due to the passage of a positive voltage pulse through the input pad 106. With the parasitic diode (not shown) within the PMOS transistor 102 serving as a bypass, current surge produced by the ESD is prevented from overloading the input buffer 108 and the internal circuit 110.

In the ND mode (a negative voltage pulse is applied to the input pad 106 with the source terminal VDD connected to ground), an electrostatic discharge in the form of a negative voltage pulse is applied to the input pad 106. The negative voltage pulse is transmitted to the drain terminal of the PMOS transistor 102. Moreover, the voltage source VDD terminal can be regarded as the ground connected during the ESD transient. Hence, once the negative voltage pulse exceeds the avalanche breakdown voltage of the drain and the substrate terminal of the PMOS transistor 102, the junction between the drain terminal and the substrate terminal breaks down. Ultimately, the drain terminal and the substrate terminal of the PMOS transistor 102 form an ESD bypass preventing the overloading of the input buffer 108 and the internal circuit 110.

In FIG. 1, if the input buffer is changed to an output buffer and the input pad 106 is changed to an output pad, the circuit is immediately transformed into an electrostatic discharge protection circuit for protecting an output buffer.

However, following the miniaturization of semiconductor devices, thickness of the gate oxide layer within the PMOS transistor 112 and the NMOS transistor 114 of the input buffer 108 must be reduced. Hence, the avalanche breakdown voltage of the gate oxide layer is reduced correspondingly. If the avalanche breakdown voltage of the gate oxide layer for the PMOS transistor 112 and the NMOS transistor 114 approaches the cumulative junction breakdown voltage between the PMOS transistor 102 and the NMOS transistor 104, the high voltage discharge may punch through the gate oxide layer of both the PMOS transistor 112 and the NMOS transistor 114. Thus, the PMOS transistor 112 and the NMOS transistor 114 may be severely damaged.

In addition, the PMOS transistor 102 and the NMOS transistor 104 that serve as a bypass for ESD have a multi-finger MOS layout. In general, a multi-finger MOS layout has non-uniform conductance so that ESD current rarely flows through each MOS uniformly.

SUMMARY OF THE INVENTION

Accordingly, one object of the present invention is to provide an electrostatic discharge (ESD) protection circuit for protecting input and output buffers. Through the application of a voltage to the substrate and gate terminal of a metallic-oxide-semiconductor (MOS) transistor used especially for bypassing ESD, the cumulative junction breakdown voltage of the MOS transistor is reduced and non-uniform conductance due to a multi-finger MOS layout design is improved. Consequently, damages to the input buffer, the output buffer and other internal circuits resulting from an ESD are minimized.

To achieve these and other advantages and in accordance with the purpose of the invention, as embodied and broadly described herein, the invention provides an ESD protection circuit for protecting input and output buffers. A first voltage source and a second voltage source are provided to the ESD protection circuit. The ESD protection circuit is coupled to a bonding pad. The ESD circuit comprises a first resistor, a first PMOS transistor, a first NMOS transistor, a first diode series, a second PMOS transistor, a second resistor, a third PMOS transistor, a second NMOS transistor, a second diode series and a third NMOS transistor. A first terminal of the first resistor is coupled to the second voltage source. The source terminal of the first PMOS transistor is coupled to the first voltage source and the gate terminal of the first PMOS transistor is coupled to a second terminal of the first resistor. The drain terminal of the first NMOS transistor is coupled to the drain terminal of the first PMOS transistor and the gate terminal of the first NMOS transistor is coupled to the second terminal of the first resistor. The positive terminal of the first diode series is coupled to the second voltage source and the negative terminal of the first diode series is coupled to the bonding pad. The positive terminal of one of the first diode series is coupled to the source terminal of the first NMOS transistor. The source terminal of the second PMOS transistor is coupled to the first voltage source. The drain terminal of the second PMOS transistor is coupled to the bonding pad. The gate terminal of the second PMOS transistor is coupled to a junction between the drain terminal of the first PMOS transistor and the drain terminal of the first NMOS transistor. A first terminal of the second resistor is coupled to the first voltage source. The source terminal of the second NMOS transistor is coupled to the second voltage source and the gate terminal of the second NMOS transistor is coupled to a second terminal of the second resistor. The drain terminal of the third PMOS transistor is coupled to the drain terminal of the second NMOS transistor and the gate terminal of the third PMOS transistor is coupled to the second terminal of the second resistor. The positive terminal of the second diode series is coupled to the bonding pad and the negative terminal of the second diode series is coupled to the source terminal of the third PMOS transistor. The source terminal of the third NMOS transistor is coupled to the second voltage source. The drain terminal of the third NMOS transistor is coupled to the bonding pad. The gate terminal of the third NMOS transistor is coupled to the junction between the drain terminal of the third PMOS transistor and the drain terminal of the second NMOS transistor. The ESD protection circuit further includes a few combinations of resistors that protect the input buffer or output buffer within the integrated circuits against the damaging effects due to an ESD.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
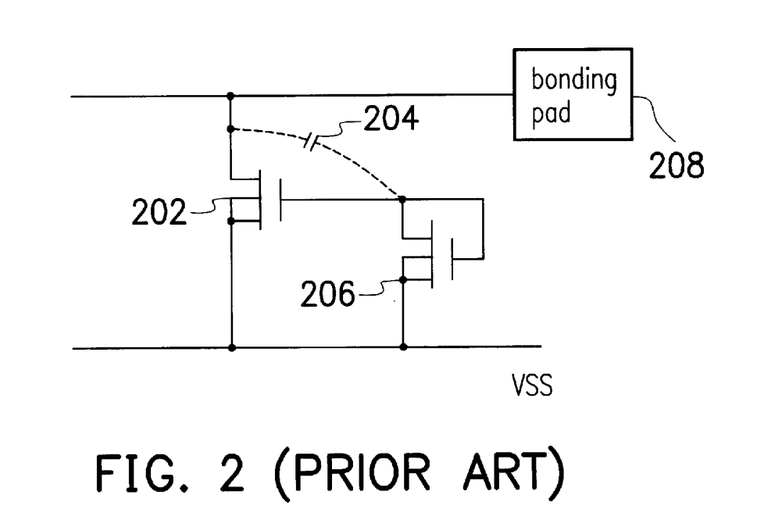
FIG. 2 is a diagram showing a gate-coupled conventional ESD protection circuit.

FIG. 2 is a diagram showing a gate-coupled conventional ESD protection circuit. As shown in FIG. 2, the drain terminal and the gate terminal of an NMOS transistor 202 (the NMOS transistor in FIG. 2 may be replaced by a PMOS transistor) form a parasitic capacitor 204. The drain terminal of the NMOS transistor 202 couples with a bonding pad 208 as well. When an electrostatic discharge (ESD) occurs between the bonding pad 208 and the voltage source VSS (in the PS mode), the parasitic capacitor 204 and the circuit structure of a neighboring NMOS transistor 206 creates an electric potential at the gate terminal of the NMOS transistor 202. The electric potential reduces the cumulative junction breakdown voltage of the drain terminal of the NMOS transistor 202.

Figure 3:
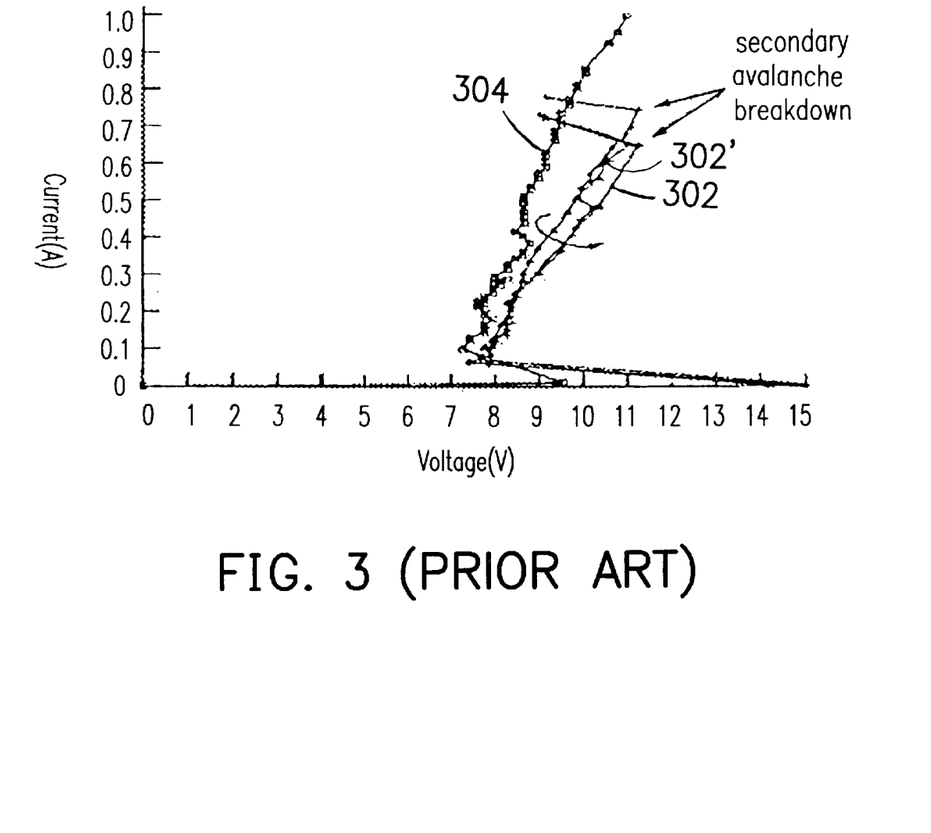
FIG. 3 is a graph showing the voltage-current curve for conventional 1.6 $\mu$m LDD fabricated gate-grounded and gate-coupled ESD protection circuit.

FIG. 3 is a graph showing voltage-current relationship for 1.6 $\mu$m LDD fabricated conventional gate-grounded circuit and gate-coupled ESD protection circuit (refer to C. Duvvury and C. Diaz, "Dynamic gate coupling of NMOS for efficient output ESD protection," Proc. of IRPS, pp. 141–150, 1992). In FIG. 3, the curves 302 and 302' represent the voltage-current relationship of gate-grounded ESD protection circuit (as shown in FIG. 1). According to the curves 302 and 302', the cumulative junction breakdown voltage of the gate-grounded circuit when an ESD between the bonding pad 208 and the voltage source VSS occurs is 15V and the maximum ESD current supporting capacity does not exceed 0.8 A. The curve 304 indicates the current-voltage relationship for the gate-coupled ESD protection circuit (as shown in FIG. 2). The cumulative junction breakdown voltage of the gate-coupled circuit when an ESD between the bonding pad 208 and the voltage source VSS occurs is reduced to about 9.5V and the ESD current supporting capacity is raised to about 1 A. Hence, whenever ESD between the bonding pad 208 and the voltage source VSS occurs, the cumulative junction breakdown voltage of the gate-coupled circuit (shown in FIG. 2) is lower than the gate-grounded circuit (shown in FIG. 1). Furthermore, ESD robustness of the gate-coupled circuit is better than the gate-grounded circuit.

Figure 4:
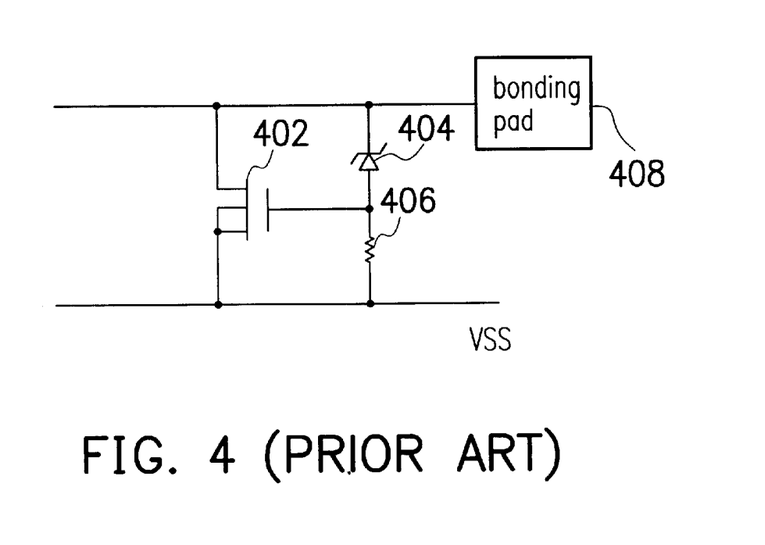
FIG. 4 is a diagram showing a conventional gate-triggered ESD protection circuit.

FIG. 4 is a diagram showing a conventional gate-triggered ESD protection circuit. As shown in FIG. 4, the gate terminal of an NMOS transistor 402 (the NMOS transistor in FIG. 4 may be replaced by a PMOS transistor) is coupled to the junction between a Zener diode 404 and a resistor 406. The drain terminal of the NMOS transistor 402 is coupled to a bonding pad 408. An ESD between the bonding pad 408 and the voltage source VSS (in the PS mode) triggers the flow of a current through the resistor 406 due to a reverse breakdown of the Zener diode 404. Hence, an electric potential is created at the gate terminal of the NMOS transistor 402. This electric potential reduces the cumulative junction breakdown voltage at the drain terminal of the NMOS transistor 402. Consequently, the gate-triggered circuit in FIG. 4 has similar functional characteristics as the gate-coupled circuit in FIG. 2 such as a lower cumulative junction breakdown voltage and a higher ESD robustness.

Figure 5:
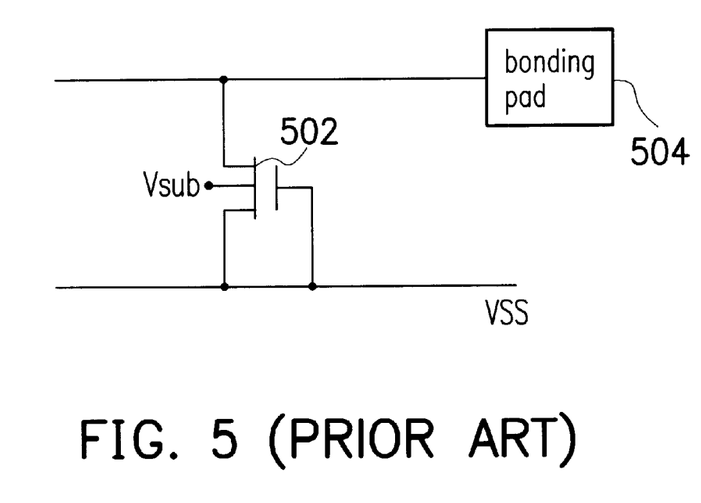
FIG. 5 is a diagram showing a conventional gate-grounded and substrate-biased circuit.
Figure 6:
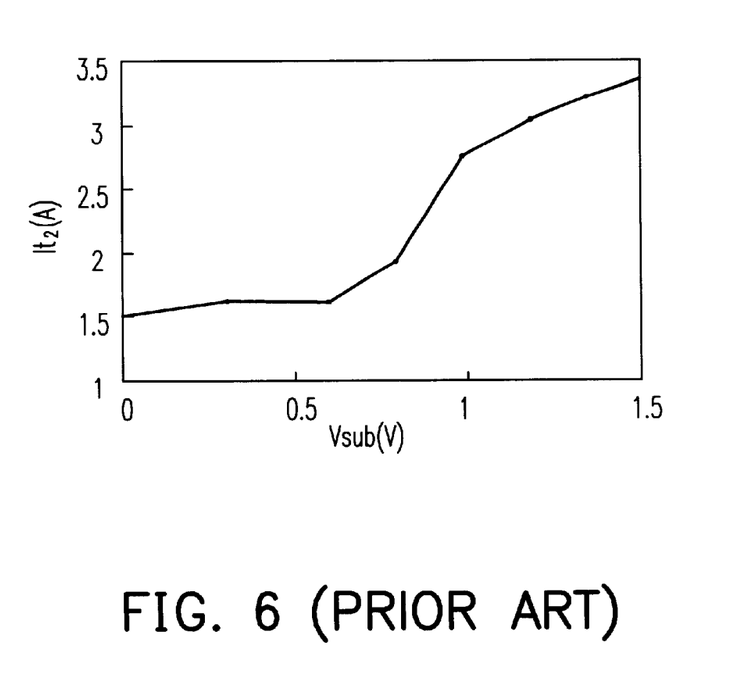
FIG. 6 is a graph showing the voltage-current curve for a conventional 0.6 $\mu$m CMOS technique fabricated gate-grounded and substrate biased ESD protection circuit.

FIG. 5 is a diagram showing a conventional gate-grounded and substrate-biased circuit. As shown in FIG. 5, the only difference with the circuit in FIG. 1 is the addition of a substrate bias voltage Vsub at the substrate terminal of the NMOS transistor 502. FIG. 6 is a graph showing the voltage-current curve for a conventional 0.6 μm CMOS technique fabricated gate-grounded and substrate biased ESD protection circuit (refer to M.-D Ker, T.-Y Chen, and C.-Y. Wu, "CMOS on-chip ESD protection design with substrate-triggering technique," Proc. of ICECS, Vol. 1, pp. 273–276, 1998). When ESD between the bonding pad 504 and the voltage source VSS occurs (in the PS mode), the bias voltage Vsub at the substrate terminal of the NMOS transistor 502 increases from 0V to 1V. Hence, the ESD current $It_2$ supporting capacity of the NMOS transistor 502 increases from 1.5 A to about 2.8 A. In other words, the introduction of the substrate bias voltage to the substrate terminal of the NMOS transistor 502 improves the ESD robustness of the NMOS transistor 502. This invention incorporates similar design to increase ESD robustness and current supporting capacity of ESD protection circuits.

Figure 7:
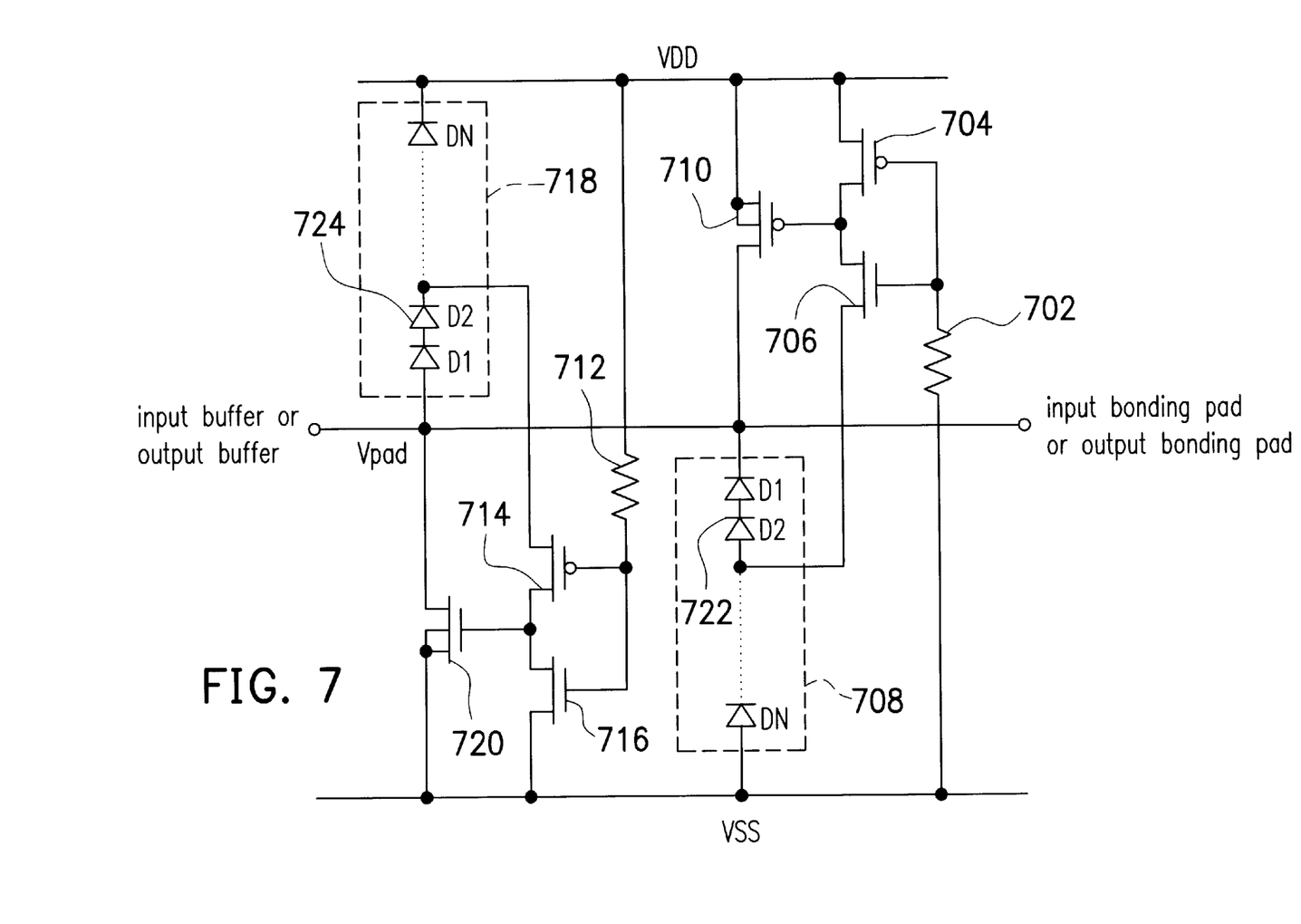
FIG. 7 is a diagram showing a first type of ESD protection circuit according to this invention.

FIG. 7 is a diagram showing a first type of ESD protection circuit according to this invention. As shown in FIG. 7, a first terminal of a resistor 702 is coupled to a voltage source VSS. The source terminal of a PMOS transistor 704 is coupled to a voltage source VDD. The gate terminal of the PMOS transistor 704 is coupled to a second terminal of the resistor 702. The drain terminal of an NMOS transistor 706 is coupled to the drain terminal of the PMOS transistor 704 and the gate terminal of the NMOS transistor 706 is coupled to the second terminal of the resistor 702. A diode series 708 having N serially connected diodes (D1, D2 ..., DN shown in FIG. 7) is also provided. The positive terminal of the diode series 708 is coupled to the voltage source VSS and the negative terminal of the diode series 708 is coupled to an input pad or an output pad. The positive terminal of the diode D2 722 within the diode series 708 is coupled to the source terminal of the NMOS transistor 706. The source terminal of a PMOS transistor 710 is coupled to the voltage source VDD. The drain terminal of the PMOS transistor 710 is coupled to the input pad or the output pad. The gate terminal of the PMOS transistor 710 is coupled to the junction between the drain terminal of the PMOS transistor 704 and the drain terminal of the NMOS transistor 706. The substrate terminal of the PMOS transistor 710 is coupled to the voltage source VDD. A first terminal of a resistor 712 is coupled to the voltage source VDD. The source terminal of an NMOS transistor 716 is coupled to the voltage source VSS and the gate terminal of the NMOS transistor 716 is coupled to a second terminal of the resistor 712. The drain terminal of a PMOS transistor 714 is coupled to the drain terminal of an NMOS transistor 716 and the gate terminal of the PMOS transistor 714 is coupled to the second terminal of the resistor 712. A diode series 718 having N serially connected diodes (D1, D2, ..., DN shown in FIG. 7) is also provided. The positive terminal of the diode series 718 is coupled to the input pad or output pad and the negative terminal of the diode series 718 is coupled to voltage source VDD. The positive terminal of the diode D2 724 within the diode series 718 is coupled to the source terminal of the PMOS transistor 714. The source terminal of an NMOS transistor 720 is coupled to the voltage source VSS. The drain terminal of the NMOS transistor 720 is coupled to the input pad or the output pad. The gate terminal of the NMOS transistor 720 is coupled to the junction between the drain terminal of the PMOS transistor 714 and the drain terminal of the NMOS transistor 716. The substrate terminal of the NMOS transistor 720 is coupled to the voltage source VSS. An input buffer or an output buffer is coupled to the input pad or the output pad respectively.

When the integrated circuit (not shown) is operating in a normal mode and voltage Vpad at the input pad or the output pad is VSS, potentials at the positive and the negative terminal of the diode series 708 are identical. Hence, the diode series 708 is non-conductive. Since the gate terminal of the PMOS transistor 704 and the NMOS transistor 706 are both connected to the VSS terminal, the PMOS transistor 704 is conductive but the NMOS transistor 706 is cut off. The gate terminal of the PMOS transistor 710 is at VDD and hence the PMOS transistor 710 is also cut off. Therefore, the cumulative junction breakdown voltage for the PMOS transistor 710 is higher than the voltage difference between VDD and VSS and prevents the cumulative breakdown of the PMOS transistor 710. Furthermore, the diode series 718 is in reverse-bias and hence the diode series 718 is non-conductive. The gate terminal of the PMOS transistor 714 and the NMOS transistor 716 are connected to the voltage source VDD and hence the NMOS transistor 716 is conductive but the NMOS transistor 714 is cut off. Since the gate terminal of the NMOS transistor 720 is connected to the voltage source VSS, the NMOS transistor 720 is cut off. Because the drain terminal and the substrate terminal of the NMOS transistor 720 are at an identical potential, cumulative breakdown of the NMOS transistor 720 is prevented.

If the voltage Vpad applied to the input pad or the output pad is VDD, the diode series 708 is at reverse-bias. Hence, the diode series 708 is non-conductive. Since the gate terminal of the PMOS transistor 704 and the NMOS transistor 706 are connected to the voltage source VSS, the PMOS transistor 704 is conductive but the NMOS transistor 706 is cut off. The gate terminal of the PMOS transistor 710 receives voltage VDD and hence the PMOS transistor 710 is cut off. The source terminal and the substrate terminal of the PMOS transistor 710 are at an identical potential and hence cumulative breakdown of the PMOS transistor 710 is prevented. Furthermore, the positive terminal and negative terminal of the diode series 718 are at an identical potential and hence the diode series 718 is non-conductive. The gate terminal of the PMOS transistor 714 and the NMOS transistor 716 are both connected to the voltage source VDD and hence the PMOS transistor 714 is cut off but the NMOS transistor 716 is conductive. The gate terminal of the NMOS transistor 720 is connected to the voltage source VSS and hence the NMOS transistor 720 is cut off. Hence, the cumulative junction breakdown voltage of the NMOS transistor 720 is higher than the voltage difference between the voltage VDD and the voltage VSS and cumulative breakdown of the NMOS transistor 720 is prevented. In brief, the ESD bypass PMOS transistor 710 and the NMOS transistor 720 inside the ESD protection circuit has no effect on the normal operation of the integrated circuit.

When an electrostatic discharge occurs at the input pad or the output pad relative to the voltage source VDD and the voltage source VSS, the ESD protection circuit as shown in FIG. 7 operates according to the impulsive mode. The following is a description of the ESD protection circuit under various modes including the PS mode, the NS mode, the PD mode and the ND mode.

In the PS mode, ESD in the form of a positive voltage pulse is fed to the input pad or the output pad. The voltage source VDD and the voltage source VSS can be regarded as having 0V during the ESD transient. Since voltage at the Vpad terminal due to the positive voltage pulse is greater than the forward bias voltage drop Vstring of the diode series 718, voltage at the source terminal of the PMOS transistor 714 is the voltage drop of the negative terminal of the diode D2 724. At this time, the gate terminals of the PMOS transistor 714 and the NMOS transistor 716 are closed to 0V and hence the PMOS transistor 714 is conductive but the NMOS transistor 716 is cut off. A suitable voltage appears at the gate terminal of the NMOS transistor 720. In addition, the ESD positive voltage pulse has a voltage greater than the cumulative breakdown voltage of the NMOS transistor 720. With the appearance of a suitable voltage at the gate terminal of the NMOS transistor 720, the cumulative junction breakdown voltage for the NMOS transistor 720 is lowered according to the curve 304 in FIG. 3. Furthermore with the increased flow of ESD current through the NMOS transistor 720, ESD robustness of the NMOS transistor 720 is increased. Thus, the NMOS transistor 720 inside the ESD protection circuit shown in FIG. 7 has an ESD bypassing capacity considerably greater than the corresponding NMOS transistor 104 shown in FIG. 1 and hence provides a better ESD protection of the input and output buffers.

In the NS mode, ESD in the form of a negative voltage pulse is fed to the input pad or the output pad. The voltage source VDD and the voltage source VSS can be regarded as having 0V during the ESD transient. Since the substrate terminal and the drain terminal of the NMOS transistor 720 form a parasitic diode (not shown), the parasitic diode can bypass the incoming negative ESD voltage pulse from the input pad or the output pad in the forward bias direction. Moreover, the positive terminal of the diode series 708 is at 0V while the negative terminal of the diode series 708 is subjected to the negative voltage pulse. Voltage difference between the negative voltage pulse and the 0V is sufficient to drive the diode series 708 into a forward bias. Hence, the diode series 708 provides another bypass channel for ESD. Through the parasitic diode (not shown) provided by the NMOS transistor 720 and the diode series 708, considerable ESD current is bypassed. Thus, the NMOS transistor 720 and the diode series 708 inside the ESD protection circuit shown in FIG. 7 has an ESD bypassing capacity considerably greater than the corresponding NMOS transistor 104 shown in FIG. 1 and hence provides a greater protection to both input and output buffers.

In the PD mode, ESD in the form of a positive voltage pulse is fed to the input pad or the output pad. The voltage source VDD and the voltage source VSS can be regarded as having 0V during the ESD transient. Since the substrate terminal and the drain terminal of the PMOS transistor 710 form a parasitic diode (not shown), the parasitic diode can bypass the incoming positive ESD voltage pulse from the input pad or the output pad in the forward bias direction. Moreover, the positive terminal of the diode series 718 is subjected to the positive voltage pulse while the negative terminal of the diode series 718 is at 0V. Voltage difference between the positive voltage pulse and the 0V is sufficient to drive the diode series 718 into a forward bias. Hence, the diode series 718 provides another bypass channel for ESD. Through the parasitic diode (not shown) provided by the PMOS transistor 710 and the diode series 718, considerable ESD current is bypassed. Thus, the PMOS transistor 710 and the diode series 718 inside the ESD protection circuit shown in FIG. 7 has an ESD bypassing capacity considerably greater than the corresponding PMOS transistor 102 shown in FIG. 1 and hence provides a greater protection to both input and output buffers.

In the ND mode, ESD in the form of a negative voltage pulse is fed to the input pad or the output pad. The voltage source VDD and the voltage source VSS can be regarded as having 0V during the ESD transient. Since voltage at the Vpad terminal due to the negative voltage pulse is greater than the forward bias voltage drop Vstring of the diode series 708, voltage at the source terminal of the NMOS transistor 706 is the voltage drop of the positive terminal of the diode D2 708. At this time, the gate terminal of the PMOS transistor 704 and the NMOS transistor 706 is close to 0V and hence the PMOS transistor 704 is cut off but the NMOS transistor 706 is conductive. A suitable voltage appears at the gate terminal of the PMOS transistor 710. In addition, the absolute value of the ESD negative voltage pulse has a voltage greater than the cumulative breakdown voltage of the PMOS transistor 710. With the appearance of a suitable voltage at the gate terminal of the PMOS transistor 710, the cumulative junction breakdown voltage for the PMOS transistor 710 is lowered according to the curve 304 in FIG. 3. Furthermore, with the increased flow of ESD current through the PMOS transistor 710, ESD robustness of the PMOS transistor 710 is increased. Thus, the PMOS transistor 710 inside the ESD protection circuit shown in FIG. 7 has an ESD bypassing capacity considerably greater than the corresponding PMOS transistor 102 shown in FIG. 1 and provides a better ESD protection to the input and output buffers.

Figure 8:
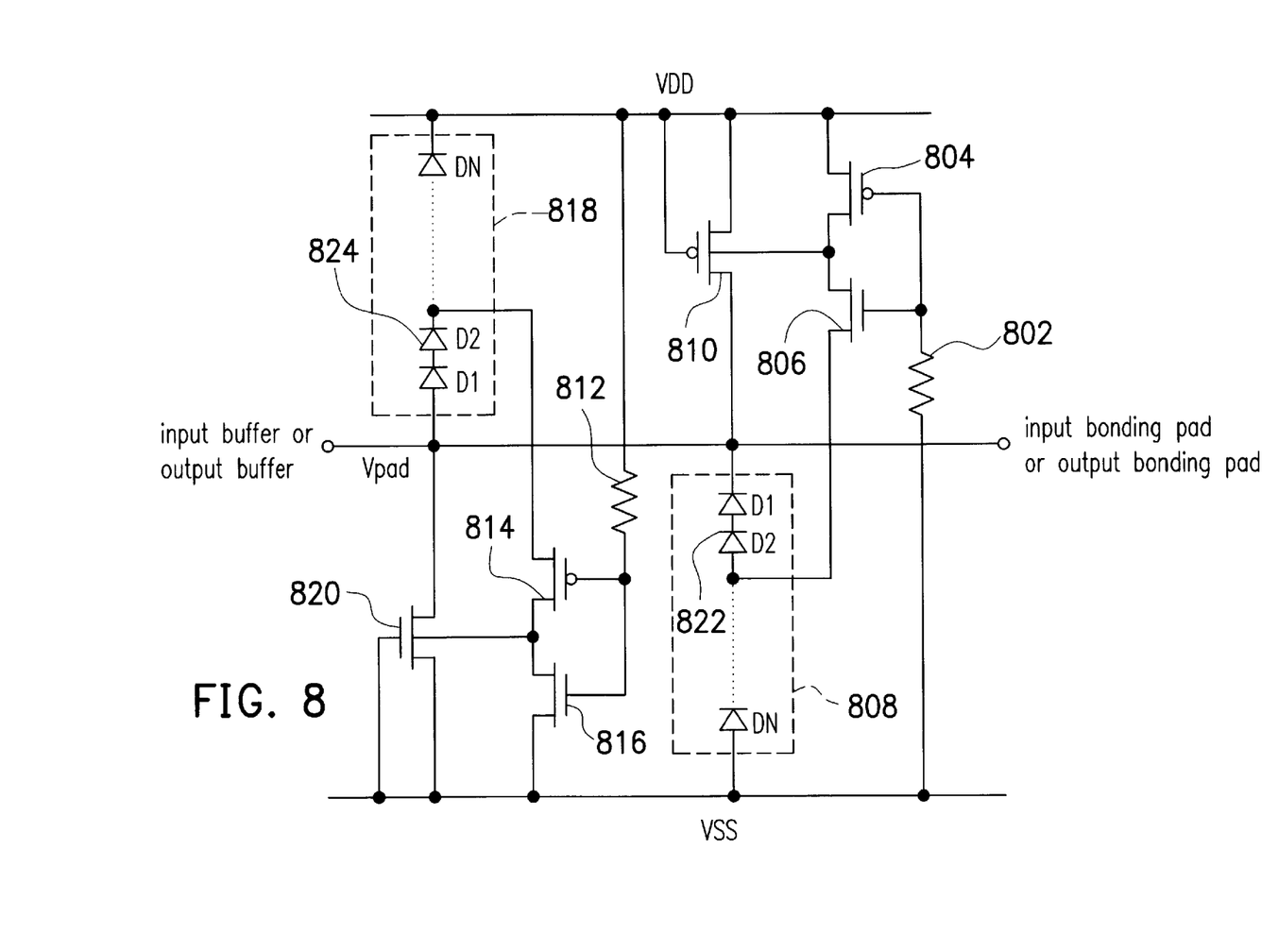
FIG. 8 is a diagram showing a second type of ESD protection circuit according to this invention.

FIG. 8 is a diagram showing a second type of ESD protection circuit according to this invention. As shown in FIG. 8, a first terminal of a resistor 802 is coupled to a voltage source VSS. The source terminal of a PMOS transistor 804 is coupled to a voltage source VDD. The gate terminal of the PMOS transistor 804 is coupled to a second terminal of the resistor 802. The drain terminal of an NMOS transistor 806 is coupled to the drain terminal of the PMOS transistor 804 and the gate terminal of the NMOS transistor 806 is coupled to the second terminal of the resistor 802. A diode series 808 having N serially connected diodes (D1, D2, ..., DN shown in FIG. 8) is also provided. The positive terminal of the diode series 808 is coupled to the voltage source VSS and the negative terminal of the diode series 808 is coupled to an input pad or an output pad. The positive terminal of the diode D2 822 within the diode series 808 is coupled to the source terminal of the NMOS transistor 806. The source terminal of a PMOS transistor 810 is coupled to the voltage source VDD. The drain terminal of the PMOS transistor 810 is coupled to the input pad or the output pad.

The gate terminal of the PMOS transistor 810 is coupled to the voltage source VDD. The substrate terminal of the PMOS transistor 810 is coupled to the junction between the drain terminal of the PMOS transistor 804 and the drain terminal of the NMOS transistor 806. A first terminal of a resistor 812 is coupled to the voltage source VDD. The source terminal of an NMOS transistor 816 is coupled to the voltage source VSS and the gate terminal of the NMOS transistor 816 is coupled to a second terminal of the resistor 812. The drain terminal of a PMOS transistor 814 is coupled to the drain terminal of an NMOS transistor 816 and the gate terminal of the PMOS transistor 814 is coupled to the second terminal of the resistor 812. A diode series 818 having N serially connected diodes (D1, D2, . . . , DN shown in FIG. 8) is also provided. The positive terminal of the diode series 818 is coupled to the input pad or output pad and the negative terminal of the diode series 818 is coupled to voltage source VDD. The negative terminal of the diode D2 824 within the diode series 818 is coupled to the source terminal of the PMOS transistor 814. The source terminal of an NMOS transistor 820 is coupled to the voltage source VSS. The drain terminal of the NMOS transistor 820 is coupled to the input pad or the output pad. The gate terminal of the NMOS transistor 820 is coupled to the voltage source VSS. The substrate terminal of the NMOS transistor 820 is coupled to the junction between the drain terminal of the PMOS transistor 814 and the drain terminal of the NMOS transistor 816. An input buffer or an output buffer is coupled to the input pad or the output pad respectively.

When the integrated circuit (not shown) is operating in a normal mode and voltage Vpad at the input pad or the output pad is VSS, potentials at the positive and the negative terminal of the diode series 808 are identical. Hence, the diode series 808 is non-conductive. Since the gate terminal of the PMOS transistor 804 and the NMOS transistor 806 are both connected to the VSS terminal, the PMOS transistor 804 is conductive but the NMOS transistor 806 is cut off. The gate terminal of the PMOS transistor 810 is at VDD and hence the PMOS transistor 810 is also cut off. Therefore, the cumulative junction breakdown voltage for the PMOS transistor 810 is higher than the voltage difference between VDD and VSS and prevents the cumulative breakdown of the PMOS transistor 810. Furthermore, the diode series 818 is in reverse-bias and hence the diode series 818 is non-conductive. The gate terminal of the PMOS transistor 814 and the NMOS transistor 816 are connected to the voltage source VDD and hence the PMOS transistor 814 is cut off but the NMOS transistor 816 is conductive. Since the gate terminal of the NMOS transistor 820 is connected to the voltage source VSS, the NMOS transistor 820 is cut off. Because the drain terminal and the substrate terminal of the NMOS transistor 820 are at an identical potential, cumulative breakdown of the NMOS transistor 820 is prevented.

If the voltage Vpad applied to the input pad or the output pad is VDD, the diode series 808 is at reverse-bias. Hence, the diode series 808 is non-conductive. Since the gate terminal of the PMOS transistor 804 and the NMOS transistor 806 are connected to the voltage source VSS, the PMOS transistor 804 is conductive but the NMOS transistor 806 is cut off. The gate terminal of the PMOS transistor 810 receives voltage VDD and hence the PMOS transistor 810 is cut off. The drain terminal and the substrate terminal of the PMOS transistor 810 are at identical potential and hence cumulative breakdown of the PMOS transistor 810 is prevented. Furthermore, the positive terminal and negative terminal of the diode series 818 are at an identical potential and hence the diode series 818 is non-conductive. The gate terminal of the PMOS transistor 814 and the NMOS transistor 816 are both connected to the voltage source VDD and hence the PMOS transistor 814 is cut off but the NMOS transistor 816 is conductive. The gate terminal of the NMOS transistor 820 is connected to the voltage source VSS and hence the NMOS transistor 820 is cut off. Hence, the cumulative junction breakdown voltage of the NMOS transistor 820 is higher than the voltage difference between the voltage VDD and the voltage VSS and cumulative breakdown of the NMOS transistor 820 is prevented. In brief, the ESD bypass PMOS transistor 810 and the NMOS transistor 820 inside the ESD protection circuit have no effect on the normal operation of the integrated circuit.

When an electrostatic discharge occurs at the input pad or the output pad relative to the voltage source VDD and the voltage source VSS, the ESD protection circuit as shown in FIG. 8 operates according to the impulsive mode. The following is a description of the ESD protection circuit under various modes including the PS mode, the NS mode, the PD mode and the ND mode.

In the PS mode, ESD in the form of a positive voltage pulse is fed to the input pad or the output pad. The voltage source VDD and the voltage source VSS can be regarded as having 0V during the ESD transient. Since voltage at the Vpad terminal due to the positive voltage pulse is greater than the forward bias voltage drop Vstring of the diode series 818, voltage at the source terminal of the PMOS transistor 814 is the voltage drop of the negative terminal of the diode D2 824. At this time, the gate terminal of the PMOS transistor 814 and the NMOS transistor 816 is close to 0V and hence the PMOS transistor 814 is conductive but the NMOS transistor 816 is cut off. A suitable voltage appears at the gate terminal of the NMOS transistor 820. In addition, the ESD positive voltage pulse has a voltage greater than the cumulative breakdown voltage of the NMOS transistor 820. With the appearance of a suitable voltage at the gate terminal of the NMOS transistor 820, ESD current flowing through the NMOS transistor 820 is greatly increased according to the voltage Vsub versus current $It_2$ curve in FIG. 6. In other words, ESD robustness of the NMOS transistor 820 is increased. Thus, the NMOS transistor 820 inside the ESD protection circuit shown in FIG. 8 has an ESD bypassing capacity considerably greater than the corresponding NMOS transistor 104 shown in FIG. 1 and hence provides a better ESD protection of the input and output buffers.

In the NS mode, ESD in the form of a negative voltage pulse is fed to the input pad or the output pad. The voltage source VDD and the voltage source VSS can be regarded as having 0V during the ESD transient. Since the substrate terminal and the drain terminal of the NMOS transistor 820 form a parasitic diode (not shown), the parasitic diode can bypass the incoming negative ESD voltage pulse from the input pad or the output pad in the forward bias direction. Moreover, the positive terminal of the diode series 808 is at 0V while the negative terminal of the diode series 808 is subjected to the negative voltage pulse. Voltage difference between the negative voltage pulse and the 0V is sufficient to drive the diode series 808 into a forward bias. Hence, the diode series 808 provides another bypass channel for ESD. Through the parasitic diode (not shown) provided by the NMOS transistor 820 and the diode series 808, considerable ESD current is bypassed. Thus, the NMOS transistor 820 and the diode series 808 inside the ESD protection circuit shown in FIG. 8 has an ESD bypassing capacity considerably greater than the corresponding NMOS transistor 104 shown in FIG. 1 and hence provides a greater protection to both input and output buffers.

In the PD mode, ESD in the form of a positive voltage pulse is fed to the input pad or the output pad. The voltage source VDD and the voltage source VSS can be regarded as having 0V during the ESD transient. Since the substrate terminal and the drain terminal of the PMOS transistor 810 form a parasitic diode (not shown), the parasitic diode can bypass the incoming positive ESD voltage pulse from the input pad or the output pad in the forward bias direction. Moreover, the positive terminal of the diode series 818 is subjected to the positive voltage pulse while the negative terminal of the diode series 818 is at 0V. Voltage difference between the positive voltage pulse and the 0V is sufficient to drive the diode series 818 into a forward bias. Hence, the diode series 818 provides another bypass channel for ESD. Through the parasitic diode (not shown) provided by the PMOS transistor 810 and the diode series 818, considerable ESD current is bypassed. Thus, the PMOS transistor 810 and the diode series 818 inside the ESD protection circuit shown in FIG. 8 has an ESD bypassing capacity considerably greater than the corresponding PMOS transistor 102 shown in FIG. 1 and hence provides a greater protection to both input and output buffers.

In the ND mode, ESD in the form of a negative voltage pulse is fed to the input pad or the output pad. The voltage source VDD and the voltage source VSS can be regarded as having 0V during the ESD transient. Since voltage at the Vpad terminal due to the negative voltage pulse is greater than the forward bias voltage drop Vstring of the diode series 808, voltage at the source terminal of the NMOS transistor 806 is the voltage drop of the positive terminal of the diode D2 822. At this time, the gate terminal of the PMOS transistor 804 and the NMOS transistor 806 is close to 0V and hence the PMOS transistor 804 is cut off but the NMOS transistor 806 is conductive. A suitable voltage appears at the gate terminal of the PMOS transistor 810. In addition, the absolute value of the ESD negative voltage pulse has a voltage greater than the cumulative breakdown voltage of the PMOS transistor 810. With the appearance of a suitable voltage at the gate terminal of the PMOS transistor 810, ESD current flowing through the PMOS transistor 810 is greatly increased according to the voltage Vsub versus current $It_2$ curve in FIG. 6. In other words, ESD robustness of the PMOS transistor 810 is increased. Thus, the PMOS transistor 810 inside the ESD protection circuit shown in FIG. 8 has an ESD bypassing capacity considerably greater than the corresponding PMOS transistor 102 shown in FIG. 1 and hence provides a better ESD protection of the input and output buffers.

Figure 9:
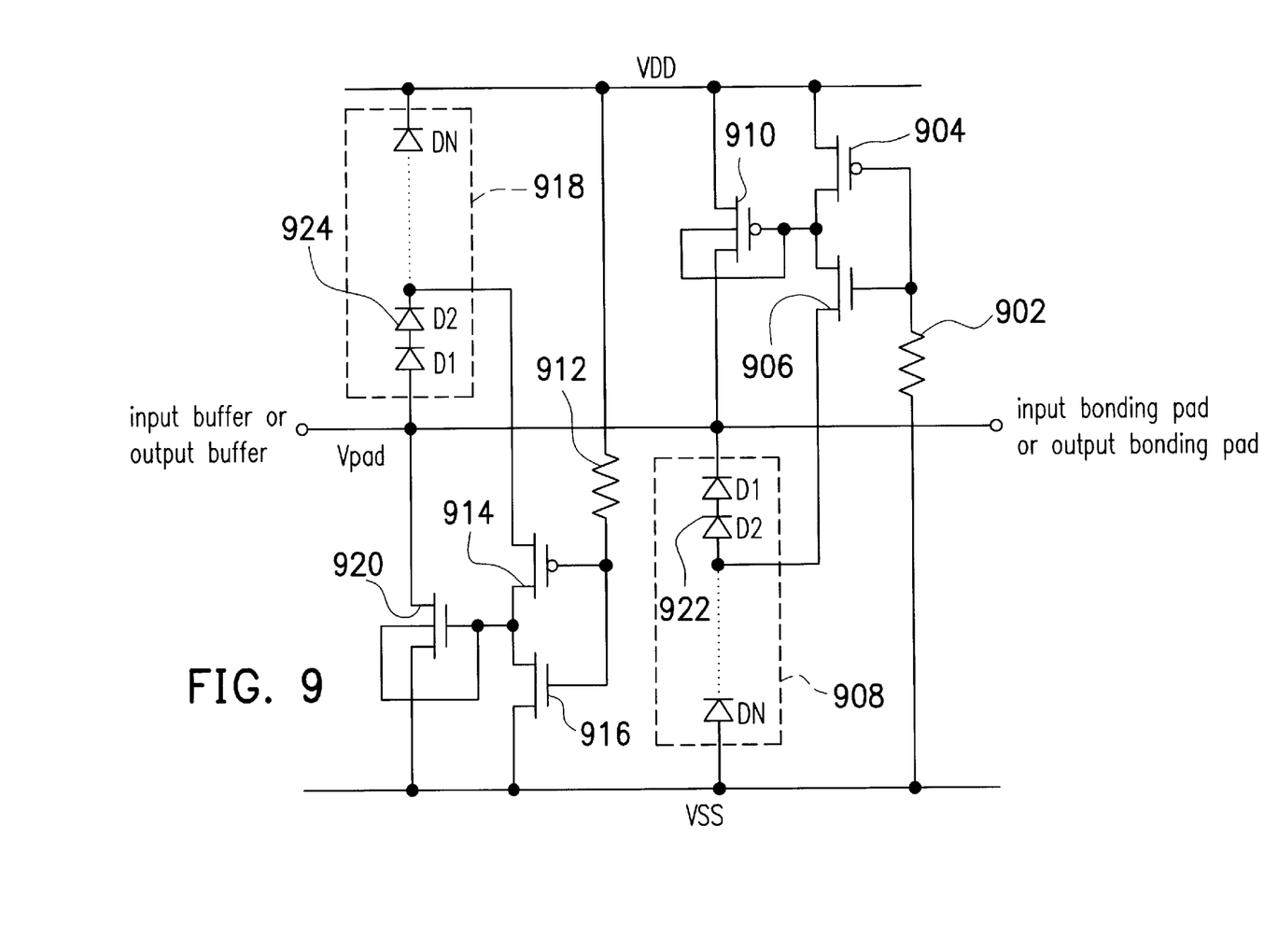
FIG. 9 is a diagram showing a third type of ESD protection circuit according to this invention.

FIG. 9 is a diagram showing a third type of ESD protection circuit according to this invention. As shown in FIG. 9, a first terminal of a resistor 902 is coupled to a voltage source VSS. The source terminal of a PMOS transistor 904 is coupled to a voltage source VDD. The gate terminal of the PMOS transistor 904 is coupled to a second terminal of the resistor 902. The drain terminal of an NMOS transistor 906 is coupled to the drain terminal of the PMOS transistor 904 and the gate terminal of the NMOS transistor 906 is coupled to the second terminal of the resistor 902. A diode series 908 having N serially connected diodes (D1, D2, . . . , DN shown in FIG. 9) is also provided. The positive terminal of the diode series 908 is coupled to the voltage source VSS and the negative terminal of the diode series 908 is coupled to an input pad or an output pad. The positive terminal of the diode D2 922 within the diode series 908 is coupled to the source terminal of the NMOS transistor 906. The source terminal of a PMOS transistor 910 is coupled to the voltage source VDD. The drain terminal of the PMOS transistor 910 is coupled to the input pad or the output pad. The substrate terminal of the PMOS transistor 910 is coupled to the junction between the PMOS transistor 904 and the drain terminal of the NMOS transistor 906. The gate terminal and the substrate terminal of the PMOS transistor 910 are connected together. A first terminal of a resistor 912 is coupled to the voltage source VDD. The source terminal of an NMOS transistor 916 is coupled to the voltage source VSS and the gate terminal of the NMOS transistor 916 is coupled to a second terminal of the resistor 912. The drain terminal of a PMOS transistor 914 is coupled to the drain terminal of an NMOS transistor 916 and the gate terminal of the PMOS transistor 914 is coupled to the second terminal of the resistor 912. A diode series 918 having N serially connected diodes (D1, D2, . . . , DN shown in FIG. 9) is also provided. The positive terminal of the diode series 918 is coupled to the input pad or output pad and the negative terminal of the diode series 918 is coupled to the voltage source VDD. The negative terminal of the diode D2 924 within the diode series 918 is coupled to the source terminal of the PMOS transistor 914. The source terminal of an NMOS transistor 920 is coupled to the voltage source VSS. The drain terminal of the NMOS transistor 920 is coupled to the input pad or the output pad. The substrate terminal of the NMOS transistor 920 is coupled to the junction between the drain terminal of the PMOS transistor 914 and the drain terminal of the NMOS transistor 916. The gate terminal and the substrate terminal of the NMOS transistor 920 are connected together. An input buffer or an output buffer is coupled to the input pad or the output pad respectively.

When the integrated circuit (not shown) is operating in a normal mode and voltage Vpad at the input pad or the output pad is VSS, potentials at the positive and the negative terminal of the diode series 908 are identical. Hence, the diode series 908 is non-conductive. Since the gate terminal of the PMOS transistor 904 and the NMOS transistor 906 are both connected to the VSS terminal, the PMOS transistor 904 is conductive but the NMOS transistor 906 is cut off. The gate terminal of the PMOS transistor 910 is at VDD and hence the PMOS transistor 910 is also cut off. Therefore, the cumulative junction breakdown voltage for the PMOS transistor 910 is higher than the voltage difference between VDD and VSS and prevents the cumulative breakdown of the PMOS transistor 910. Furthermore, the diode series 918 is in reverse-bias and hence the diode series 918 is non-conductive. The gate terminal of the PMOS transistor 914 and the NMOS transistor 916 are connected to the voltage source VDD and hence the PMOS transistor 914 is cut off but the NMOS transistor 916 is conductive. Since the gate terminal of the NMOS transistor 920 is connected to the voltage source VSS, the NMOS transistor 920 is cut off. Because the drain terminal and the substrate terminal of the NMOS transistor 920 are at an identical potential, cumulative breakdown of the NMOS transistor 920 is prevented.

If the voltage Vpad applied to the input pad or the output pad is VDD, the diode series 908 is at reverse-bias. Hence, the diode series 908 is non-conductive. Since the gate terminal of the PMOS transistor 904 and the NMOS transistor 906 are connected to the voltage source VSS, the PMOS transistor 904 is conductive but the NMOS transistor 906 is cut off. The gate terminal of the PMOS transistor 910 receives voltage VDD and hence the PMOS transistor 910 is cut off. The drain terminal and the substrate terminal of the PMOS transistor 910 are at identical potential and hence cumulative breakdown of the PMOS transistor 910 is prevented. Furthermore, the positive terminal and negative terminals of the diode series 918 are at an identical potential and hence the diode series 918 is non-conductive. The gate terminal of the PMOS transistor 914 and the NMOS transistor 916 are both connected to the voltage source VDD and hence the PMOS transistor 914 is cut off but the NMOS transistor 916 is conductive. The gate terminal and the substrate terminal of the NMOS transistor 920 are connected to the voltage source VSS and hence the NMOS transistor 920 is cut off. Hence, the cumulative junction breakdown voltage of the NMOS transistor 920 is higher than the voltage difference between the voltage VDD and the voltage VSS and cumulative breakdown of the NMOS transistor 920 is prevented. In brief, the ESD bypass PMOS transistor 910 and the NMOS transistor 920 inside the ESD protection circuit have no effect on the normal operation of the integrated circuit.

When an electrostatic discharge occurs at the input pad or the output pad relative to the voltage source VDD and the voltage source VSS, the ESD protection circuit as shown in FIG. 9 operates according to the impulsive mode. The following is a description of the ESD protection circuit under various modes including the PS mode, the NS mode, the PD mode and the ND mode.

In the PS mode, ESD in the form of a positive voltage pulse is fed to the input pad or the output pad. The voltage source VDD and the voltage source VSS can be regarded as having 0V during the ESD transient. Since voltage at the Vpad terminal due to the positive voltage pulse is greater than the forward bias voltage drop Vstring of the diode series 918, voltage at the source terminal of the PMOS transistor 914 is the voltage drop of the negative terminal of the diode D2 924. At this time, the gate terminal of the PMOS transistor 914 and the NMOS transistor 916 is close to 0V and hence the PMOS transistor 914 is conductive but the NMOS transistor 916 is cut off. A suitable voltage appears at the gate terminal of the NMOS transistor 920. In addition, the ESD positive voltage pulse has a voltage greater than the cumulative breakdown voltage of the NMOS transistor 920. With the appearance of a suitable voltage at the gate terminal of the NMOS transistor 920, the cumulative junction breakdown voltage of the NMOS transistor 920 is reduced according to the curve 304 in FIG. 3 and the voltage Vsub versus current $It_2$ curve in FIG. 6. Furthermore, ESD robustness of the NMOS transistor 920 improves due to a considerable increase in ESD current flowing through the NMOS transistor 920. Thus, the NMOS transistor 920 inside the ESD protection circuit shown in FIG. 9 has an ESD bypassing capacity considerably greater than the corresponding NMOS transistor 104 shown in FIG. 1 and hence provides a better ESD protection of the input and output buffers.

In the NS mode, ESD in the form of a negative voltage pulse is fed to the input pad or the output pad. The voltage source VDD and the voltage source VSS can be regarded as having 0V during the ESD transient. Since the substrate terminal and the drain terminal of the NMOS transistor 920 form a parasitic diode (not shown), the parasitic diode can bypass the incoming negative ESD voltage pulse from the input pad or the output pad in the forward bias direction. Moreover, the positive terminal of the diode series 908 is at 0V while the negative terminal of the diode series 908 is subjected to the negative voltage pulse. Voltage difference between the negative voltage pulse and the 0V is sufficient to drive the diode series 908 into a forward bias. Hence, the diode series 908 provides another bypass channel for ESD. Through the parasitic diode (not shown) provided by the NMOS transistor 920 and the diode series 908, considerable ESD current is bypassed. Thus, the NMOS transistor 920 and the diode series 908 inside the ESD protection circuit shown in FIG. 9 has an ESD bypassing capacity considerably greater than the corresponding NMOS transistor 104 shown in FIG. 1 and hence provides a greater protection to both input and output buffers.

In the PD mode, ESD in the form of a positive voltage pulse is fed to the input pad or the output pad. The voltage source VDD and the voltage source VSS can be regarded as having 0V during the ESD transient. Since the substrate terminal and the drain terminal of the PMOS transistor 910 form a parasitic diode (not shown), the parasitic diode can bypass the incoming positive ESD voltage pulse from the input pad or the output pad in the forward bias direction. Moreover, the positive terminal of the diode series 918 is subjected to the positive voltage pulse while the negative terminal of the diode series 918 is at 0V. Voltage difference between the positive voltage pulse and the 0V is sufficient to drive the diode series 918 into a forward bias. Hence, the diode series 918 provides another bypass channel for ESD. Through the parasitic diode (not shown) provided by the PMOS transistor 910 and the diode series 918, considerable ESD current is bypassed. Thus, the PMOS transistor 910 and the diode series 918 inside the ESD protection circuit shown in FIG. 9 has an ESD bypassing capacity considerably greater than the corresponding PMOS transistor 102 shown in FIG. 1 and hence provides a greater protection to both input and output buffers.

In the ND mode, ESD in the form of a negative voltage pulse is fed to the input pad or the output pad. The voltage source VDD and the voltage source VSS can be regarded as having 0V during the ESD transient. Since the absolute value of negative voltage pulse at the Vpad terminal is greater than the forward bias voltage drop Vstring of the diode series 908, voltage at the source terminal of the NMOS transistor 806 is the voltage drop of the positive terminal of the diode D2 922. At this time, the gate terminal of the PMOS transistor 904 and the NMOS transistor 906 is close to 0V and hence the PMOS transistor 904 is cut off but the NMOS transistor 906 is conductive. A suitable voltage appears at the gate terminal of the PMOS transistor 910. In addition, the absolute value of the ESD negative voltage pulse has a voltage greater than the cumulative breakdown voltage of the PMOS transistor 910. With the appearance of a suitable voltage at the gate terminal of the PMOS transistor 910, the cumulative junction breakdown voltage of the PMOS transistor 910 is reduced according to the curve 304 in FIG. 3 and the voltage Vsub versus current $It_2$ curve in FIG. 6. Furthermore, ESD robustness of the PMOS transistor 910 improves due to a considerable increase in ESD current flowing through the PMOS transistor 910. Thus, the PMOS transistor 910 inside the ESD protection circuit shown in FIG. 9 has an ESD bypassing capacity considerably greater than the corresponding PMOS transistor 102 shown in FIG. 1 and hence provides a better ESD protection of the input and output buffers.

In conclusion, one advantage of this invention is the capacity to reduce cumulative junction breakdown voltage of MOS transistor used for bypassing ESD buildup and improve the non-uniform conductance in a multi-finger MOS transistor layout design. A second advantage of this invention is the increase of the robustness of MOS transistors used in bypassing an ESD surge.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit for protecting input and output buffers, wherein the electrostatic discharge protection circuit is connected to a first voltage source and a second voltage source and coupled to a bonding pad, the ESD protection circuit comprising:

a first resistor having a first terminal coupled to the second voltage source;

a first PMOS transistor having a source terminal coupled to the first voltage source and a gate terminal coupled to a second terminal of the first resistor;

a first NMOS transistor having a drain terminal coupled to a drain terminal of the first PMOS transistor and a gate terminal coupled to the second terminal of the first resistor;

a first diode series having a positive terminal coupled to the second voltage source and a negative terminal coupled to the bonding pad and having a positive terminal of one diode in the first diode series coupled to a source terminal of the first NMOS transistor;

a second PMOS transistor having a source terminal coupled to the first voltage source, a drain terminal coupled to the bonding pad and a gate terminal connected to a junction between the drain terminal of the first PMOS transistor and the drain terminal of the first NMOS transistor;

a second resistor having a first terminal coupled to the first voltage source;

a second NMOS transistor having a source terminal coupled to the second voltage source and a gate terminal coupled to a second terminal of the second resistor;

a third PMOS transistor having a drain terminal coupled to a drain terminal of the second NMOS transistor and a gate terminal coupled to the second terminal of the second resistor;

a second diode series having a positive terminal coupled to the bonding pad and a negative terminal coupled to the first voltage source and having a negative terminal of one diode in the second diode series coupled to a source terminal of the third PMOS transistor; and a third NMOS transistor having a source terminal coupled to the second voltage source, a drain terminal coupled to the bonding pad and a gate terminal coupled to a junction between the drain terminal of the third PMOS transistor and the drain terminal of the second NMOS transistor.

2. The circuit of claim 1, wherein the first diode series and the second diode series comprise a plurality of serially connected diodes.

3. The circuit of claim 1, wherein the bonding pad is an input pad or an output pad.

4. The circuit of claim 3, wherein the input buffer and the output buffer are connected to the input pad and the output pad, respectively.

5. An electrostatic discharge (ESD) protection circuit for protecting input and output buffers, wherein the electrostatic discharge protection circuit is connected to a first voltage source and a second voltage source and coupled to a bonding pad, the ESD protection circuit comprising:

a first resistor having a first terminal coupled to the second voltage source;

a first PMOS transistor having a source terminal coupled to the first voltage source and the gate terminal coupled to a second terminal of the first resistor;

a first NMOS transistor having a drain terminal coupled to the drain terminal of the first PMOS transistor and a gate terminal coupled to a second terminal of the first resistor;

first diode series having a positive terminal coupled to the second voltages source and a negative terminal coupled to the bonding pad and having a positive terminal of one diode in the diode series coupled to a source terminal of the first NMOS transistor;

a second PMOS transistor having a source terminal coupled to the first voltage source, a drain terminal coupled to the bonding pad, a substrate terminal coupled to a junction between the drain terminal of the first PMOS transistor and the drain terminal of the first NMOS transistor and a gate terminal coupled to the first voltage source;

a second resistor having a first terminal coupled to the first voltage source;

a second NMOS transistor having a source terminal coupled to the second voltage source and a gate terminal coupled to a second terminal of the second resistor;

a third PMOS transistor having a drain terminal coupled to a drain terminal of the second NMOS transistor and a gate terminal coupled to the second terminal of the second resistor;

a second diode series having a positive terminal coupled to the bonding pad and a negative terminal coupled to the first voltage source and having the negative terminal of one diode in the second diode series coupled to a source terminal of the third PMOS transistor; and a third NMOS transistor having a source terminal coupled to the second voltage source, a drain terminal coupled to the bonding pad, a substrate terminal coupled to a junction between the drain terminal of the third PMOS transistor and the drain terminal of the second NMOS transistor and a gate terminal coupled to the second voltage source.

6. The circuit of claim 5, wherein the first diode series and the second diode series comprise a plurality of serially connected diodes.

7. The circuit of claim 5, wherein the bonding pad is an input pad or an output pad.

8. The circuit of claim 7, wherein the input buffer and the output buffer are connected to the input pad and the output pad, respectively.

9. An electrostatic discharge (ESD) protection circuit for protecting input and output buffer, wherein the electrostatic discharge protection circuit is connected to a first voltage source and a second voltage source and coupled to a bonding pad, the ESD protection circuit comprising:

a first resistor having a first terminal coupled to the second voltage source;

a first PMOS transistor having a source terminal coupled to the first voltage source and the gate terminal coupled to a second terminal of the first resistor;

a first NMOS transistor having a drain terminal coupled to the drain terminal of the first PMOS transistor and a gate terminal coupled to a second terminal of the first resistor;

a first diode series having a positive terminal coupled to the second voltages source and a negative terminal coupled to the bonding pad and having the positive terminal of one diode in the diode series coupled to a source terminal of the first NMOS transistor;

a second PMOS transistor having a source terminal coupled to the first voltage source, a drain terminal coupled to the bonding pad, a substrate terminal coupled to a junction between the drain terminal of the first PMOS transistor and the drain terminal of the first NMOS transistor and a gate terminal coupled to the substrate terminal of the second PMOS transistor;

a second resistor having a first terminal coupled to the first voltage source;

a second NMOS transistor having a source terminal coupled to the second voltage source and a gate terminal coupled to a second terminal of the second resistor;

a third PMOS transistor having a drain terminal coupled to a drain terminal of the second NMOS transistor and a gate terminal coupled to the second terminal of the second resistor;

a second diode series having a positive terminal coupled to the bonding pad and a negative terminal coupled to the first voltage source and having a negative terminal of one diode in the second diode series coupled to a source terminal of the third PMOS transistor; and a third NMOS transistor having a source terminal coupled to the second voltage source, a drain terminal coupled to the bonding pad, a substrate terminal coupled to a junction between the drain terminal of the third PMOS transistor and the drain terminal of the second NMOS transistor and a gate terminal coupled to the substrate terminal of the third NMOS transistor.

10. The circuit of claim 9, wherein the first diode series and the second diode series comprise a plurality of serially connected diodes.

11. The circuit of claim 9, wherein the bonding pad is an input pad or an output pad.

12. The circuit of claim 11, wherein the input buffer and the output buffer are connected to the input pad and the output pad, respectively.

* * * * *